(12) United States Patent
Paul et al.

(10) Patent No.: US 9,494,661 B2
(45) Date of Patent: Nov. 15, 2016

(54) THREE-DIMENSIONAL HALL SENSOR FOR DETECTING A SPATIAL MAGNETIC FIELD

(71) Applicant: Micronas GmbH, Freiburg im Breisgau (DE)

(72) Inventors: Oliver Paul, Au (DE); Patrick Ruther, Karlsruhe (DE); Aftab Taimur, Freiburg im Breisgau (DE)

(73) Assignee: Micronas GmbH, Freiburg im Breisgau (DE)

( * ) Notice: Subject to any disclaimer, the term of this patent is extended or adjusted under 35 U.S.C. 154(b) by 204 days.

(21) Appl. No.: 14/284,368

(22) Filed: May 21, 2014

(65) Prior Publication Data

US 2014/0347045 A1    Nov. 27, 2014

(30) Foreign Application Priority Data

May 22, 2013 (DE) .................. 10 2013 209 514

(51) Int. Cl.
  *G01R 33/06* (2006.01)
  *G01R 33/07* (2006.01)
  *G01R 33/00* (2006.01)
  *G01R 33/02* (2006.01)

(52) U.S. Cl.
  CPC ......... *G01R 33/072* (2013.01); *G01R 33/0005* (2013.01); *G01R 33/0206* (2013.01); *G01R 33/07* (2013.01)

(58) Field of Classification Search
  CPC ...................................... G01R 33/07
  USPC ........................................... 324/251
  See application file for complete search history.

(56) References Cited

U.S. PATENT DOCUMENTS

| | | | |
|---|---|---|---|
| 8,134,361 B2 * | 3/2012 | Azumi | B82Y 25/00 324/207.21 |
| 8,203,329 B2 * | 6/2012 | Hohe | G01R 33/0017 324/202 |
| 2010/0097059 A1 | 4/2010 | Estrada et al. | |
| 2012/0169329 A1 | 7/2012 | Hellwig et al. | |

FOREIGN PATENT DOCUMENTS

| | | |
|---|---|---|
| DE | 10 2009 027 338 A1 | 1/2011 |
| WO | WO 2005/029604 A1 | 3/2005 |

* cited by examiner

*Primary Examiner* — Reena Aurora
(74) *Attorney, Agent, or Firm* — Brinks Gilson & Lione

(57) ABSTRACT

A three-dimensional Hall sensor can be used for detecting a spatial magnetic field. A method for measuring a spatial magnetic field can be performed using this Hall sensor. The Hall sensor comprises an electrically conducting base body and at least three electrode pairs, wherein each electrode pair has a first terminal and a second terminal, which are arranged such on the base body, that a current can flow from the first terminal to the second terminal through the base body. At least three first terminals are arranged on a first surface of the base body and at least three second terminals are arranged on the second surface, different from the first surface of the base body, wherein the first and the second surfaces oppose each other.

18 Claims, 7 Drawing Sheets

(a)

(b)

THREE-DIMENSIONAL HALL SENSOR FOR DETECTING A SPATIAL MAGNETIC FIELD

The present disclosure relates to a three-dimensional Hall sensor for detecting the spatial magnetic field. Furthermore, the present disclosure relates to a method for measuring the spatial magnetic field using the Hall sensor. Measuring of a three-dimensional magnetic field B, i.e. of its three components Bx, By and Bz relative to the coordinate system x, y, z is of great technical relevance.

Hall sensors are for example often used for contact-free measurement of motion using magnetic interaction between one or several permanent magnets and the Hall sensor. Such measurements of motion and position are used for example for the control of machine tools, for pneumatic systems, automation technology, robotics and in the area of the automotive sector.

A contact-free detection of motions also offers the advantage of being wear-free. Amongst the known contact-free measuring methods the optical and magnetic methods are most widely used. While optical methods guarantee a very high precision due to the short wave length of light, magnetic methods are far less sensitive towards pollution and damage, in particular since magnets and sensor components can be completely encapsulated in a magnetic and hermetically sealed casing.

Many manufacturers offer displacement encoder systems, in which the position of the movable permanent magnet is determined by a three-dimensional Hall sensor. Hereby, two or optimally three mutually orthogonal components of the magnetic fields have to be measured so as to capture the linear relative motion at a location; their ratio is evaluated for orientation detection. This approach has the advantage that in locations in which one of the field components reaches an extremum and thus does not detect small position changes, the other field component becomes all the more sensitive towards displacements, so that on average an equally high sensitivity is achieved throughout the measuring range. However, it is essential that all three components $B_x$, $B_y$ and $B_z$ can be measured with equal, i.e. isotropic sensitivity.

A widespread category of magnetic field sensors is using the Hall effect in semiconductors, in particular in silicon chips, which are manufactured by semiconductor technologies. Due to technological limitations, the structures which are used to measure the magnetic field component vertical to the surface of the chip differ considerably from sensors capable of measuring a component in the surface of the chip. In the first case the so-called Hall plate is used for measurement, which is usually a large thin n-conducting area on the chip surface with four contacts on its periphery. Such a Hall plate and the theoretical backgrounds for its manufacturing are known, for example, from the article R. S. Popović: "HALL-EFFECT DEVICES", Sensors and Actuators, 17 (1989), pages 39-53. FIG. 6 illustrates the measuring principle shown in this document using a Hall plate with four contacts to the n-conducting area for measuring of the vertical magnetic field component.

Furthermore, so-called vertical Hall sensors are known, which are for example described in the article T. Kaufmann, F. Purkl, P. Ruther, O. Paul: "NOVEL COUPLING CONCEPT FOR FIVE-CONTACT VERTICAL HALL DEVICES", Transducers'11, Beijing, China, June 5-9, 2011, pages 2855-2858, (see FIG. 7) or in the article M. Banjevic, B. Furrer, R. S. Popović: "2D CMOS INTEGRATED MAGNETOMETER BASED ON THE MINIATURIZED CIRCULAR VERTICAL HALL DEVICE", Transducers 2009, Denver, Colo., USA, June 21-25, 2009, pages 877-880, (see FIG. 8). Such vertical Hall sensors are formed by elongated or circular conducting areas, which can consist of respectively between three and 64 collinear or circularly arranged contacts.

FIG. 7 schematically shows an example of a vertical Hall sensor with five n+-diffusions for contacting a narrow deep n-well for measuring a horizontal magnetic field component.

As follows from FIG. 7, the sensor consists of a deep n-well with five n+-doped contacts, which are separated from one another by p+-diffusion areas. The outermost contacts C1 and C5 are short-circuited and form an input terminal. If a voltage Vin is applied to these contacts, assuming that the magnetic flux density B orthogonal to the longitudinal axis of the sensor is to be measured, one can ground the centrally placed n+-contact C3 and measure an output voltage between the contacts C2 and C4, which is dependent on the magnetic field.

In order to obtain a three-dimensional magnetic field sensitivity, in known sensor systems such structures are combined on the same chip into a vectoral magnetic field sensor (see for example B. P. Kejik et al.: "first fully integrated 3D Hall probe", Transducers '05, Seoul, Korea, June 5-9, 2005).

Alternatively it is also known, that multiple mutually orthogonally arranged chips with identical sensors can be combined into a system, so that each chip is responsible for measuring one component of the magnetic field. Examples for this approach are the systems HE344 and HE444 of the Hoeben Electronics Co., downloadable on Apr. 13, 2013 from http:www.hoeben.com/products.html.

A disadvantage of the integrated solution consisting from vertical and Hall plate based sensors is the different sensitivity of the combined system towards magnetic field components in the plane and vertical, or perpendicular, to the plane respectively, which substantially increases the complexity of the system consisting of the sensor chip and the electric circuitry.

If several similar mutually orthogonally arranged chips are combined, the effort for set-up and connection of the system components as well as the overall size increase.

Other solutions for measuring three magnetic field components have the disadvantage that they require that contacts are mounted or buried laterally on three-dimensional substrates, which is technically complex. Such sensors are known for example from U.S. Pat. No. 3,373,272 A and DE 1197938 B. In addition, some sensors having different arrangements of contacts on the surface of the semiconductor chip are well able to measure multiple and up to three components of the magnetic field. Though, without exception, they suffer from unequal sensitivity of the structure for the magnetic field components (see for example U.S. 2010/0097059 A1, DE 102009027338 A1 and DE 102010000769 A1).

Therefore, the complete system requires more effort for calibration and data evaluation. The fundamental reason lies in the lacking symmetry of the structure for the three spatial directions x, y, and z.

One object underlying the present disclosure is to provide a three dimensional Hall sensor with a single semiconductor structure fitted with terminals that can detect all three spatial components of the magnetic field with equal, i.e. isotropic, sensitivity.

The present disclosure is based on the idea to construct the sensor such, that the sensor structure possesses an inherent symmetry. By this, the three magnetic field components can be measured with equal sensitivity, which significantly reduces the effort needed for calibration and calculation.

In particular, the Hall sensor according to embodiments comprises an electrically conducting base body and at least three electrode pairs, so that each of the electrode pairs has a first and a second terminal arranged on the base body such that a current can flow through the base body from the first to the second terminal. The terminals of the electrode pairs can be arranged on at least two different surfaces of the base body opposing each other.

According to an embodiment, three pairs of electrodes form at least three four-contact structures each of which allows measurement of one spatial component of the magnetic field using the Hall effect, whereby the direction of the at least three measured components of the magnetic field span the three-dimensional space.

Appropriate dimensioning allows avoiding offset voltages, which are the signals between the pairs of electrodes vertical to the current flow in absence of a magnetic field and ensures an isotropic sensitivity of the sensor arrangement.

According to an embodiment, different pairs of electrode pairs have among each other common first terminals on the first surface and common second terminals on the second surface. By this, the structure and its connection to external system components such as electric circuits or measuring devices is facilitated.

A sensor arrangement better compatible with the manufacturing processes of semiconductor technology comprises at least three first terminals in a plane on a first surface of the base body and at least two second terminals in a plane on a second surface of the base body, whereby the first and second surfaces oppose each other. Such arrangement is favorably compatible with the standard procedures of semiconductor technology. By way of example the first and the second surfaces are substantially arranged in parallel.

To facilitate the calculation of the three-dimensional magnetic field vector from the measured spatial components, pairs of the electrode pairs can be arranged rotationally symmetric about an axis crossing the first and second surfaces. Likewise, the shape of the base body can be symmetric and contain at least the same rotational symmetry as the arrangement of the electrode pairs.

The number of terminals necessary to realize the magnetic field sensor is smallest, if the at least three first terminals and the at least three second terminals are arranged such, that their respective interconnecting lines each time form a triangle. In other words: according to a specific embodiment, individual terminals of the pairs of electrodes coincide and this reduces the total number of terminals.

The coordinate system defined by the interconnecting lines between the first and second terminals of the respective electrode pairs is not required to be orthogonal nor coincide with the second coordinate system used for the output of the B-field signal. An appropriate conversion between the first coordinate system defined by the electrode arrangement and the second coordinate system for the output of the measured signals for the B-field, is always possible following known mathematical models of coordinate transformation.

By way of example first three terminals on a first surface of the base body can form an equilateral triangle with respect to the centroids of the surfaces, for example the centers, of the terminals, and the second terminals on the opposite surface of the base body can also form an equilateral triangle. These two triangles arranged on the surfaces can be, in the ideal case, centered one above another and rotated by 180° towards each other. Thereby the interconnecting lines between the first and second terminals cross in one common point.

This point lies in the middle of the base body if both triangles have the same sizes. Otherwise it lies closer to the surface with the smaller triangle. This common point can be defined as an origin of a coordinate system, which is orthogonal and symmetric about a vector normal to the surface of the base body, i.e. the axes of the coordinate system confine the same angle with the vector normal to the surface of the base body. The first and the second terminals respectively form a pair of electrodes, whereby two of these electrode pairs can always be used to measure a magnetic field component. If dimensioning of this component is suitable, Hall voltages can be measured, which are in first approximation proportional to the magnetic field components Bx, By and Bz and do not have a geometric offset portion. Due to the symmetry of this structure, all three magnetic field components can be measured with the same sensitivity.

Through a transformation of coordinates by known mathematical methods, the magnetic field components in the coordinate system defined by the terminals can be easily converted into components defined e.g. by the edges of the device.

The required sensitivity is best reached by producing the base body from a low doped semiconductor material with high charge carrier mobility. This can be for example silicon, but also indium arsenide or indium antimonide can be used. In general, all materials known to a person skilled in the art having a large Hall sensitivity can be used in accordance with the principles of this disclosure. Also mixed materials and heterostructures can be used accordingly, as known to a person skilled in the art.

A cheap and established option to choose the material for the production of the basebody is n-conducting silicon.

Furthermore, the magnetic field can be designed so as to contain current guiding structures. In an embodiment of the magnetic field sensor, the base body is influenced by additional current guiding structures which are positioned inside the base body and arranged around the terminals. As a result, the current flow is focused on a central portion of the base body, which increases the current density and the sensitivity and can decrease the offset.

A method for measuring the spatial magnetic field using a three-dimensional Hall sensor can be based on the fundamental idea, that in principle all electrode pairs are equal and in the course of the respective measurements can always be used as both, terminals for supply current, and also as terminals to measure the Hall voltage. This complete symmetry and equality additionally allows using the known Orthogonal-Switching-Method and Spinning-Current-Method to suppress the offset components. Hereby the terminals of a pair of electrodes are either simply interchanged or interchanged cyclically multiple times so that the unwanted geometric, piezoelectric or thermoelectric offset components can be eliminated by averaging. The Orthogonal-Switching-Method and the Spinning-Current-Method are described for example in the article P. Munter: "a low-offset spinning-current Hall plate", Sensors and Actuators A 22, No.1-3 (1989) 743-746.

The method can include the steps of:
(a) Applying a first supply current flowing from the first to the second terminal of a first electrode pair;
(b) Measuring a first Hall voltage between the first and second terminal of a second electrode pair;

(c) Calculating a first magnetic field component, which lies vertically to the applied supply current and vertical to the connection line between the first and the second terminal of the second electrode pair, from the measured first Hall voltage.

These three steps can be conducted with interchanged electrode pairs, so that eventually at least three magnetic field components can be determined, from which the three-dimensional magnetic field vector B can be inferred. If the dimensioning of the sensor arrangement is suitable, the measurement can be carried out in each Hall voltage measuring configuration completely without offset, provided that all terminals involved in the measurement are interchanged once or interchanged cyclically multiple times.

If the method specifically uses a Hall sensor with three first terminals and at least three of the second terminals arranged such that their interconnecting lines each form a triangle, the three determined magnetic field components in a suitable dimensioning of the electrode arrangement are perpendicular to each other and can be measured isotropically. This way, measuring of the spatial magnetic field in a desired coordinate system is particularly easy.

For a better understanding, the following exemplary embodiments are explained in detail. Hereby same components are denoted with same references and same component names. Furthermore, features or combinations of features from the shown and described embodiments can present independent inventive solutions, wherein FIG. 1 shows a perspective principle presentation of the three-dimensional Hall sensor in accordance with a first embodiment;

In the following, embodiments are explained in more detail referring to the figures. A first embodiment of the three-dimensional Hall sensor 100 is schematically shown in FIG. 1.

Figure 1:
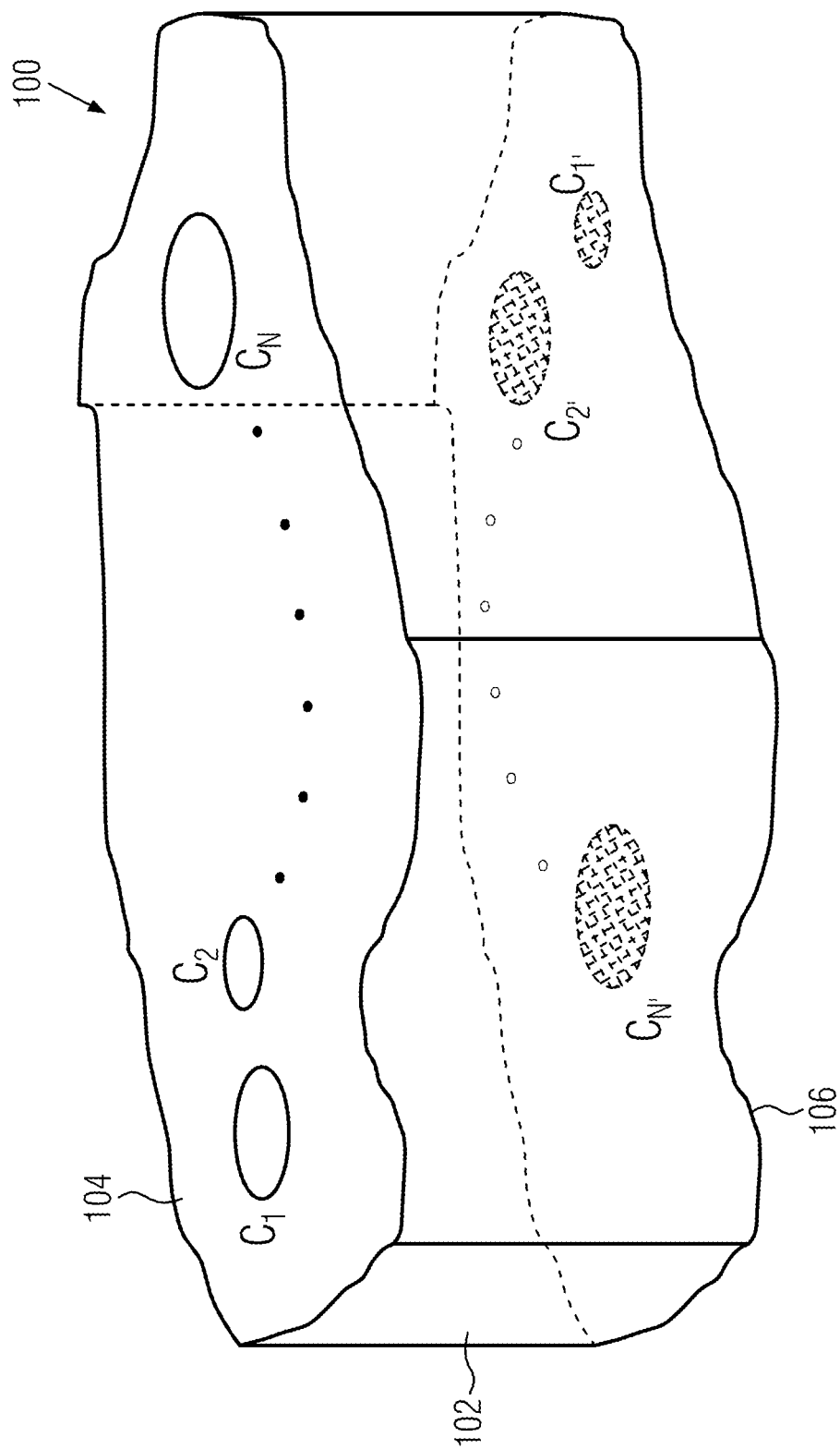

FIG. 1 is schematically showing the set up of this new magnetic field sensor in its most general embodiment. The magnetic field sensor 100 comprises a conducting substrate 102, that is restraint in one spatial direction by two ideally, but not necessarily flat surfaces 104, 106, which are ideally, but not necessarily positioned substantially in parallel with each other. In the following, the boundary surfaces 104, 106 are denoted as upper and lower boundary surface, respectively. The conducting structure can be restrained in two other spatial directions. At least three terminals $C_i$ ($i=1, 2, \ldots, N$ with $N \geq 3$) and $C_{i'}$ ($i'=1,2, \ldots, N'$ with $N' \geq 3$ and not necessarily equal to N) are integrated into the upper and lower boundary surfaces 104, 106 respectively, which allow to electrically control structure 100 and to read out the measured signals dependent on the magnetic field.

In operation of the magnetic field sensor 100, a supply voltage Vbias is applied between a terminal $C_i$ of the boundary surface 104 and a second terminal $C_{i'}$ of the opposing boundary surface 106 or equivalently a current Ibias is supplied or drawn, and, on another pair of electrodes $C_j$-$C_{j'}$ with $j \neq i$ and $j' \neq i'$ the voltage difference $\Delta V_{Hall,1}(B1) = V_j(B1) - V_{j'}(B1)$ is measured that is in first approximation linearly dependent on the magnetic field component B1.

To measure another two components B2 and B3 of the magnetic field which are linearly independent from each other and from B1, further electrode pairs $C_k$-$C_{k'}$ and $C_l$-$C_{l'}$ resp. (with $l \neq k$ and $l' \neq k'$) as well as $C_m$-$C_{m'}$ and $C_n$-$C_{n'}$ resp. (with $n \neq m$ and $n' \neq m'$) are contacted to feed the supply voltage Vbias (equivalently to feeding the supply current Ibias) or to measure the voltage difference $\Delta V_{Hall,2}(B2)$ or $\Delta V_{Hall,3}(B3)$ which is dependent on the magnetic field. The magnetic field components $B_i$ ($i=1 \ldots 3$) are ideally but not necessarily perpendicular to each other.

In the non-ideal case three orthogonal magnetic field components can be extracted from the three measured voltages in a following step after prior calibration of the sensor. From these, the three components of B in an arbitrary coordinate system can be calculated by a further coordinate transformation.

The disadvantage of the arbitrarily shaped substrate in FIG. 1 with its terminals is the generally high offset voltages and the different sensitivities for measuring the three components of B.

Figure 2:
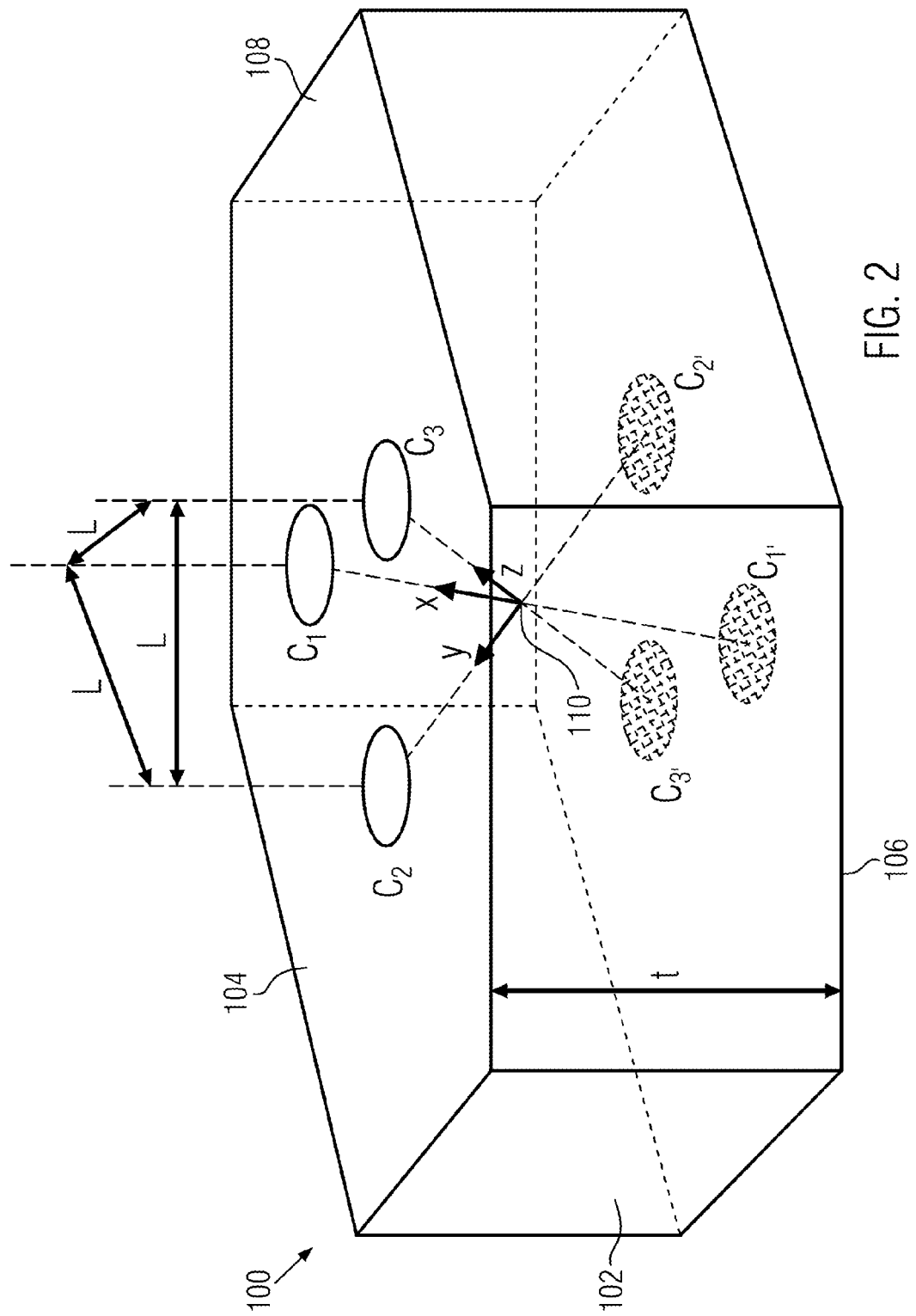
FIG. 2 shows a perspective principle presentation of a three-dimensional Hall sensor in accordance with a second embodiment.

As shown in FIG. 2, the embodiment suggests magnetic field sensors, which allow measurement of three linearly independent components B1, B2 and B3 of the magnetic field vector B using the Hall effect with equal sensitivity due to the inherent symmetry of the sensor structure. The terminals necessary for this purpose are located on opposing surfaces of the sensor structure. When the sensor structure is dimensioned appropriately the three measured magnetic field components are orthogonal to each other and can be measured with a small—if sensor structure is dimensioned appropriately—vanishing offset.

A preferred embodiment of the magnetic field sensor 100, therefore has, as shown in FIG. 2, a conducting substrate 102 with two mutually parallel, planar boundary surfaces 104, 106 and lateral boundary surfaces 108 and six terminals and has a threefold rotational and inversional symmetries. The terminals on the front and back are symmetric against rotations by ±120° about the vertical symmetry axis. The arrangements of the terminals on the back and on the front are rotated by 180° against each other.

The magnetic field sensor 100 according to this embodiment is inversionally symmetrical about a symmetry center and has threefold symmetry about an axis which is vertical towards the boundary surfaces and contains the center of symmetry. Its three terminals C1, C2, C3 on the upper boundary surface 104 and its three terminals C1', C2', C3' on the lower boundary surface 106 therefore each form equilateral triangles with the edge length L measured between the centers of the terminals. The connection lines between C1 and C1', between C2 and C2' as well as between C3 and C3' cross in the symmetry center 110 in the middle of the chip.

This common point 11 can be defined as an origin of a Cartesian coordinate system from which an x-axis is approximately pointing in direction of the terminal C1, a y-axis is approximately pointing in direction of the terminal C2 as well as a z-axis approximately pointing in direction of the terminal C3. The x-, y- and z-axes are mutually orthogonal and arranged symmetrically about the vertical symmetry axes of the magnetic field sensor. This situation is sketched in FIG. 2. It should be noted, that the direct connection lines between the electrode pairs do not necessarily intersect orthogonally with arbitrary values for the contact distance L and substrate thickness t.

In a preferred operation of the magnetic field sensor 100 from FIG. 2, initially, a supply voltage Vbias is applied between the terminals C1-C1' or equivalently a supply current Ibias is fed or pulled, and the voltage difference $\Delta V Hall,1(B1)=\Delta Voffset,1+SHallB1$ between the terminals C2-C2' is measured, which is in first approximation linearly dependent on the magnetic field component B1, hereby $\Delta Voffset,1$ and SHall denote an offset independent of the magnetic field and a magnetic sensitivity, respectively.

By applying the Orthogonal-Switching-Method or the Spinning-Current-Method, i.e. single interchange or repeated cyclic interchange of the supply terminals when using the same value for the supply current Ibias the offset $\Delta Voffset,1$ can be successfully eliminated by averaging of the measured voltage differences, so that the measured signal SHallB1 with eliminated offset remains. The direction of B1 is pointing from the inclined plane spanned by the terminals C1, C1', C2 and C2' and is essentially pointing in direction of the z-axis.

In a second measurement the magnetic field sensor 100 is operated with the terminals C2-C2' (supply voltage Vbias or equivalently supply current Ibias) and the terminals C3-C3' (determination of a second magnetic field component B2 from the measured signal SHallB2 with eliminated offset).

Eventually, in a third measurement the magnetic field sensor 100 is operated with the terminals C3-C3' (supply voltage Vbias or equivalently supply current Ibias) and the terminals C1-C1' (determination of a third magnetic field component B3 from the measured signal SHallB3 with eliminated offset).

Due to the threefold symmetry of the magnetic field sensor, the three components B1, B2 and B3 of the magnetic field vector B are measured with the equal sensitivity SHall. The components B2 and B3 essentially point in the x and y directions, respectively. When dimensioning the geometry of the magnetic field sensor and the terminal geometries accordingly, one can obtain that the three components of the magnetic field vector are perpendicular to each other, so that they represent three components of the magnetic field vector B in a Cartesian coordinate system. Equally, one can obtain a vanishing offset in the ideal case, or only small offsets to be compensated for.

In a further embodiment of the magnetic field sensor the terminals only approximately have the threefold and the inversion symmetries. It could be shown that even under such non-ideal conditions three independent components of the magnetic field can be measured and the magnetic field vector B can be calculated from these measurements without problems.

In a further embodiment of the magnetic field sensor the two upper and the two lower boundary surfaces are only approximately parallel and plane. It could be shown that even under such non-ideal conditions the three independent components of the magnetic field can be measured and the magnetic field vector B can be calculated from these measurements without problems. In a further embodiment of the magnetic field sensor the lateral boundary surfaces do not comply with the symmetry conditions. It shows that if the substrate is sufficiently large (large in relation to L and t), the specific form of the substrate in the substrate plane has only small or negligible effect on the properties of the magnetic field sensor such as sensitivity and offset.

Figure 3:
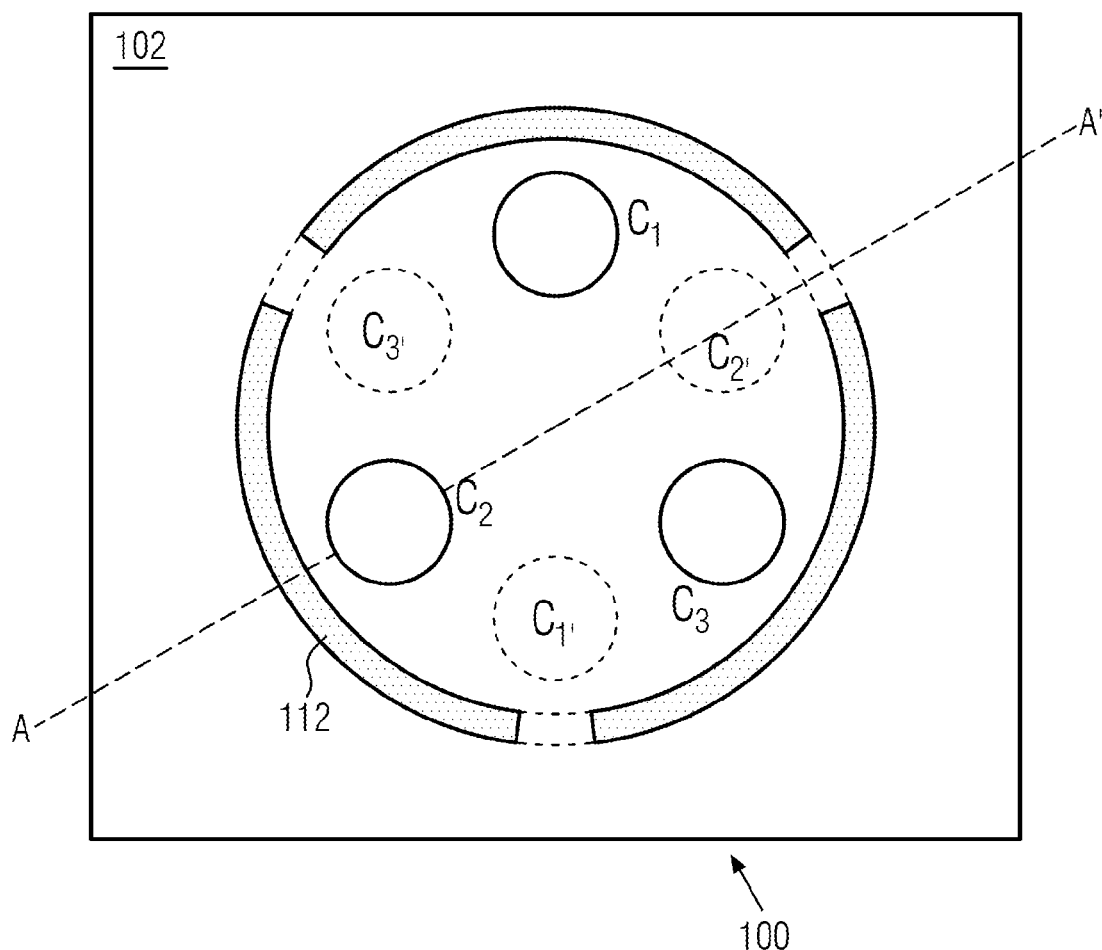
FIG. 3 shows a schematic presentation of an embodiment of the magnetic field sensor with current guiding structures (a) in top view and (b) in sectional view following line A-A' of FIG. 3(*a*)
Figure 3:
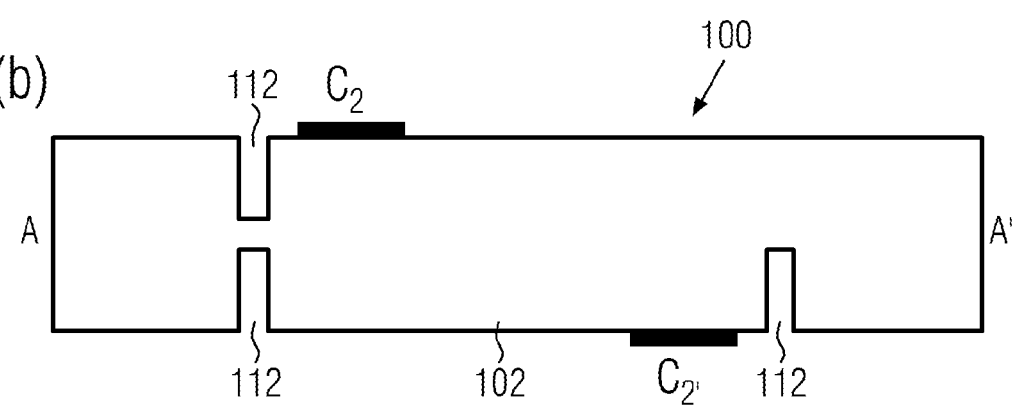

FIG. 3 shows a schematic illustration of a further advantageous embodiment of the magnetic field sensor with current guiding structures 112.

In this embodiment of the magnetic field sensor the substrate 102 is influenced by terminals additionally integrated into the substrate 102 and by the current guiding structures 112 arranged around these terminals. As a result the current flow is focused on a central area of the substrate, thereby the current density and the sensitivity increase and the offset can be reduced.

Such current guiding structures 112 can be realized in number of different ways. For example, they can be manufactured as structures integrated into the substrate (grooves, trenches, cavities). They can also be only partially filled with non-conducting material. The current guiding structures 112 can also be manufactured as portions diffused into the substrate with a doping opposite to the doping of the substrate, given that the substrate is a semiconductor material.

Hereby it is appropriate but not necessarily required, that the area defined by the current guiding structure 112 of the substrate 102 has the aforesaid symmetries, which in the ideal case allows to measure three orthogonal components of the magnetic field with identical sensitivity and vanishing offset. The substrate 102 does not necessarily have to comply with the symmetry conditions, instead it can have a simpler shape, for example it can be shaped as a cuboid.

The manufacturing of the magnetic field sensor can use for example substrates and methods from microelectronics (for example thermic oxidation, ion implantation, diffusion, sputtering of metal layers, wafer sawing, . . . ) as well as from microsystems technology (reactive, anisotropic deep etching of silicium (deep reactive ion etching, Bosch-Process)).

If the sensor has a geometry with plane-parallel boundary surfaces 104, 106 these steps are conducted analogously to the manufacturing of semiconductor-based integrated circuits. Therefore the back and front of, for example, n-doped silicon wafers are initially provided with n+-contact diffusions and are thermally activated.

The ion implantation is restrained for example through a structured thermic silicon oxide on the back and front of the silicon wafer. The electric contacting of the n+-diffusion is realized through, for example, deposition and structuring of a metalisation, for example aluminum, whose contact resistance to the n+-doped regions of the conducting structure is reduced by a thermic annealing step. This is particularly advantageous with low doped semiconductor material, which shows a large Hall effect.

The metalized contacts can be used as contact pads or, as an alternative, can be connected by conducting lines with the contact pads. Analogously, the n+-diffusion areas can be connected by further diffusing areas to the contact pads. The symmetric structure is achieved by one sided or double sided structuring of the silicon substrate, for example by reactive deep etching of silicon.

Alternatively, the substrate can be structured by deep-etched cavities, which focus the current flow between the terminals to a symmetric central area. The substrate of the magnetic field sensor in this case also can be easily detached by wafer sawing from the silicon waver. This geometry facilitates handling of the magnetic field sensor when using the standard equipment of the fabrication and assembly technologies.

The electric connection of the magnetic field sensor can be carried out with Flip-Chip-Technology, wire bonding or other common methods of the construction and connection technologies.

The suggested number of three electrode pairs defines the minimal number of contacts for measuring three linearly independent magnetic field components. If more than three electrode pairs are provided, by providing for example four, five, six or more terminals arranged in a square, pentagon or hexagon on each chip surface, by choosing different four-groups of terminals, Hall measurements can be conducted on both chip surfaces, each of which represents linear combinations of the three magnetic field components. From at least three of such measurements one can extract the three linearly independent components of the magnetic field. If more than three of such measurements are evaluated, their results are, of course, no longer mutually linear independent. This redundancy can be used to increase the precision of the extracted magnetic field components.

Figure 4:
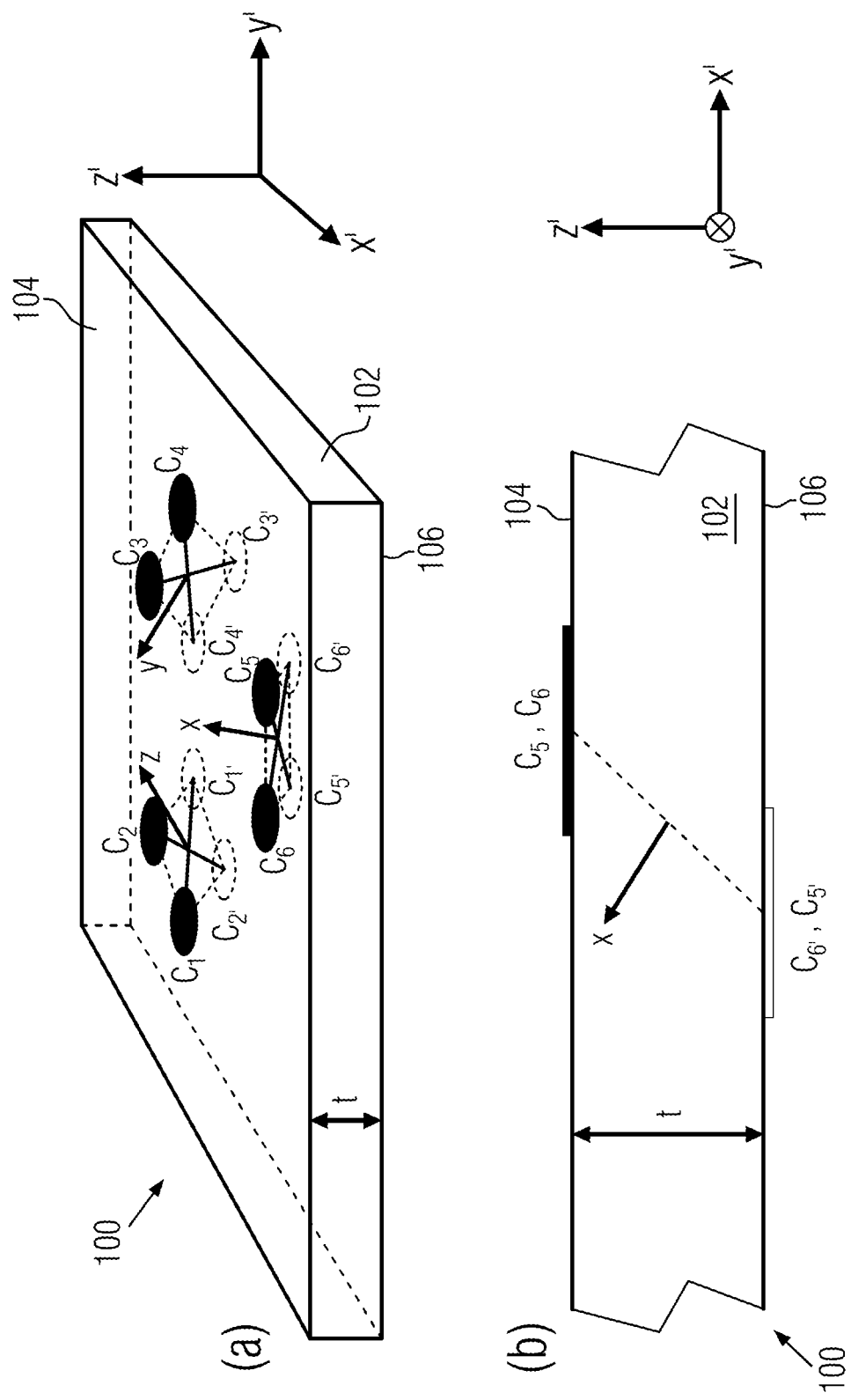
FIG. 4 shows a perspective principle presentation of a three-dimensional Hall sensor in accordance to a further embodiment, (a) in top view, (b) in side view FIG. 5 (*a*)-(*j*) shows schematic illustrations of further example electrode geometries.
Figure 5:
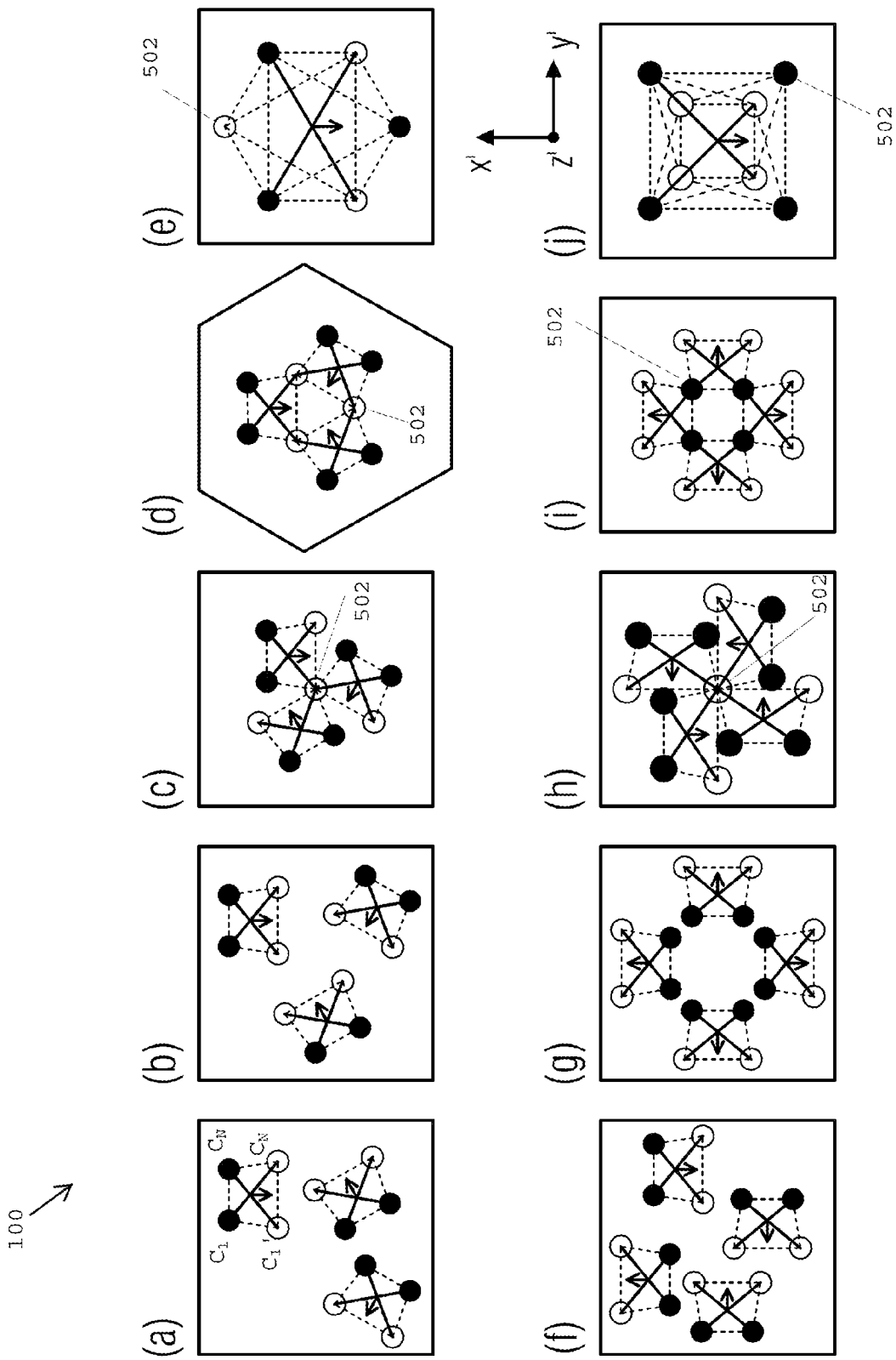
Figure 6:
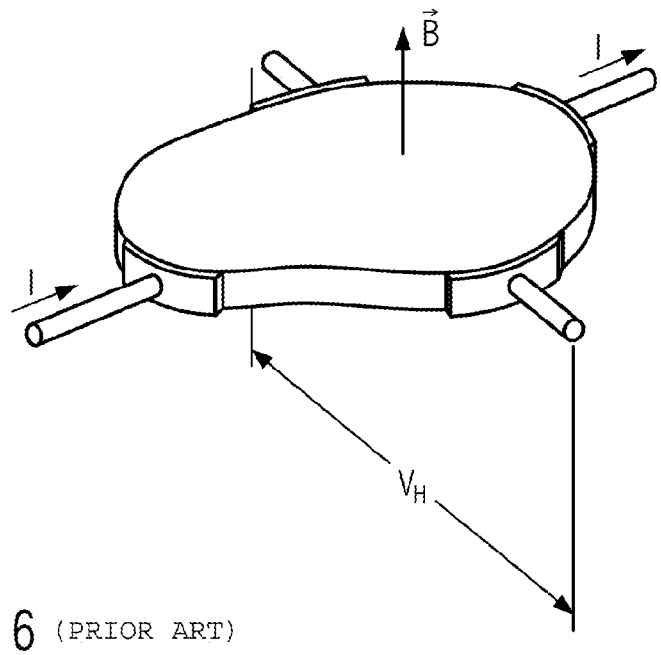
FIG. 6 shows a perspective principle presentation of a known three-dimensional Hall sensor.
Figure 7:
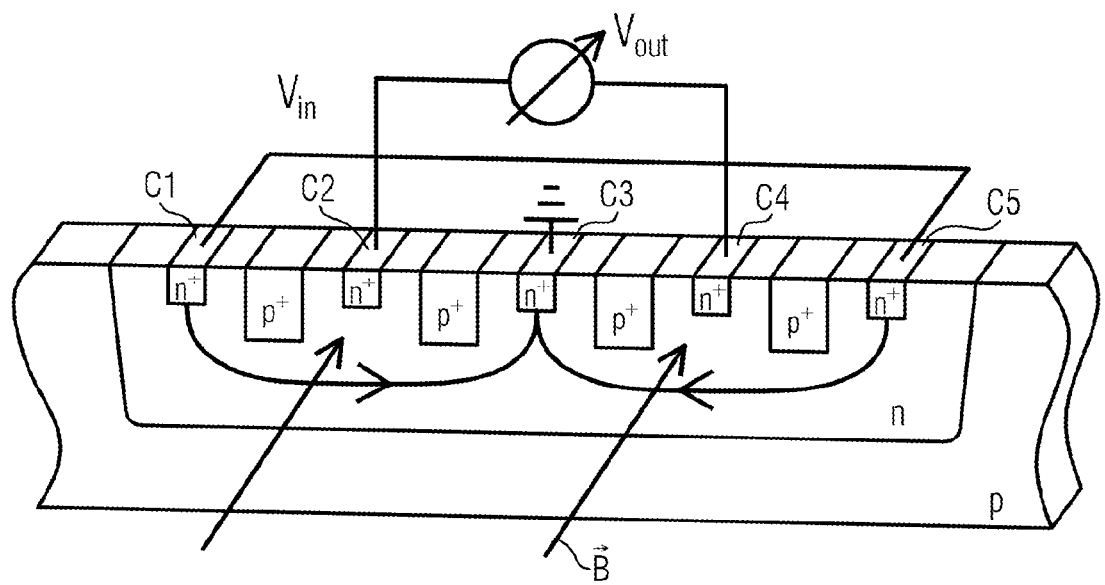
FIG. 7 shows a further known vertical Hall sensor.
Figure 8:
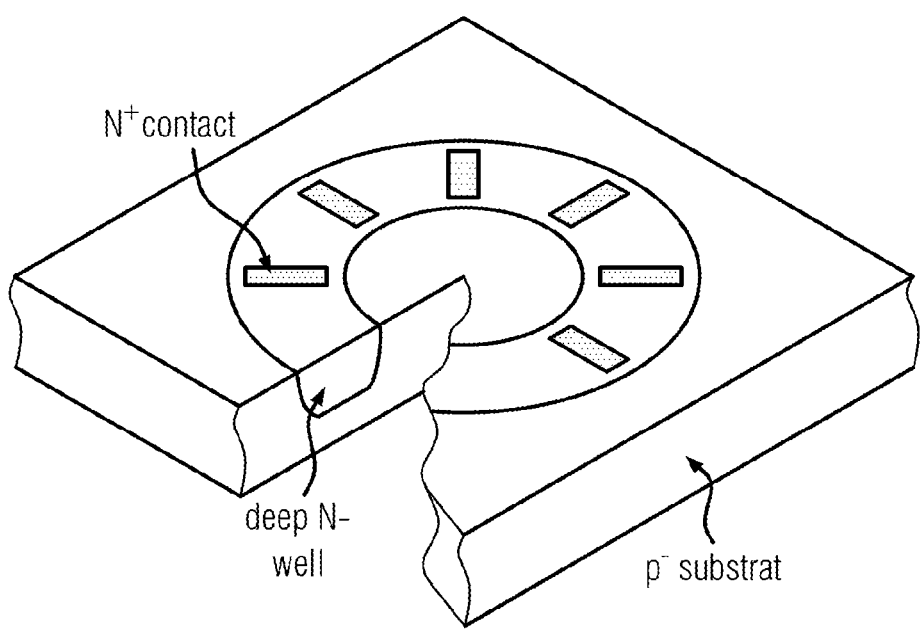
FIG. 8 shows a further known Hall sensor.

Referring to FIGS. 4 and 5, in the following further advantageous embodiments of the magnetic field sensor are explained, which partially contain more than three electrode pairs.

FIG. 4 is showing an arrangement of electrode pairs, in which two electrode pairs are each joined to form pairs of electrode pairs, i.e. to four-contact structures, which allow measuring different components of the magnetic field. FIG. 4(a) is a perspective view of three pairs of electrode pairs, which can be used for measuring of three magnetic field components in the directions x, y and z. The directions x, y and z span hereby a three-dimensional space.

FIG. 4(b) is showing a side view in y'-direction of the pair of electrode pairs (C5,C5';C6,C6'). The x-direction denotes the direction of the components of the magnetic field, which can be determined by the electrode pairs (C5,C5';C6,C6') using the Hall effect.

FIG. 5 is showing further advantageous variants of the electrode configuration. In FIGS. 5(a) and (f) magnetic field sensors 100 with arbitrary arrangements of pairs of electrodes (C1, C1'; CN, CN') are shown in FIG. 5(a) and depicted throughout FIGS. 5(b)-5(j)), in which at least three pairs of electrode pairs each have a four-contact structure, which allows to measure a spatial component of the magnetic field using the Hall effect, whereby the directions of at least three measured components of the magnetic field span the three-dimensional space.

FIGS. 5(c) to (e) as well as FIGS. 5(h) to (j) show magnetic field sensors with common terminals 502 of pairs of electrode pairs, whereby different pairs of pairs of electrodes have among themselves common first terminals on the first surface and/or common second terminals on the second surface.

Furthermore, FIGS. 5(b) to 5(e) as well as 5(g) to 5(j) show examples for an arrangement with rotational symmetry, in which pairs of electrode pairs are arranged with rotational symmetry about a common axis, which crosses the first and second surfaces.

FIGS. 5(d) as well as 5(g) to 5(j) are moreover examples for magnetic field sensor with a symmetric base body, whereby the form of the base body has the same rotational symmetry as the arrangement of electrode pairs.

FIG. 5(e) is showing a magnetic field sensor with a minimal number of three first terminals and two second terminals, whereby the three first terminals and the three second terminals are arranged in a way, that their respective interconnecting lines each form a triangle.

In each of FIGS. 5(e) and 5(j) a pair of electrodes is particularly emphasized, while the other pairs are indicated by separated different broken lines, each of which combine four terminals into a four-contact structure.

The invention claimed is:

1. A device comprising:
  a three-dimensional Hall sensor for detecting a spatial magnetic field, in which the Hall sensor comprises an electrically conducting base body and at least three electrode pairs ($C_1, C_{1'}; \ldots C_N, C_{N'}$),
  wherein each electrode pair comprises a first terminal and a second terminal, which are arranged on the base body so as to allow a current flow through the base body from the first to the second terminal,
  wherein at least three first terminals are arranged on a first surface of the base body and at least three second terminals are arranged on a second surface of the base body different from the first surface, wherein the first surface and second surface oppose each other,
  wherein at least three pairs of electrode pairs are associated to form at least three four-contact structures, each of which is operable to provide a variable voltage difference to allow measurement of one spatial component of the magnetic field using a Hall effect, wherein directions of at least three measured components of the magnetic field span a three-dimensional space.

2. The device according to claim 1, wherein different pairs of electrode pairs have common first terminals and/or common second terminals among the electrode pairs, the common first terminals being on the first surface and the common second terminals being on the second surface.

3. The device according to claim 1, wherein the first and the second surfaces are arranged substantially in parallel with each other.

4. The device according to claim 1, wherein pairs of electrode pairs are arranged rotational symmetrically about an axis, which crosses the first and the second surfaces.

5. The device according to claim 4, wherein the shape of the base body is symmetric and has the same rotational symmetry as the arrangement of the electrode pairs.

6. The device according to claim 1, wherein the at least three first terminals and the at least three second terminals are arranged such that their respective interconnecting lines each form a triangle.

7. The device according to claim 1, wherein the at least three first terminals are at least partially surrounded by a current guiding structure with an electrical conductivity lower than a material of the base body.

8. The device according to claim 7, wherein the current guiding structures are formed as structuring, comprising at least one of grooves, trenches or cavities, integrated into the base body.

9. The device according to claim 8, wherein the structuring is at least partially filled with a non-conducting material.

10. The device according to claim 7, wherein the current guiding structures are formed by areas diffused into a semiconductor substrate with a doping opposite to a doping of the substrate material.

11. The device according to claim 7, wherein the current guiding structures have a same rotational symmetry as the electrode pairs.

12. The device according to claim 1, wherein the base body is manufactured from silicon, indium arsenide, indium antimonide or another semiconductor material.

13. The device according to claim 12, wherein the base body is manufactured from n-conducting silicon.

14. A method comprising:
   measuring a spatial magnetic field using a three-dimensional Hall sensor comprising an electrically conducting base body and at least three electrode pairs ($C_1$, $C_{1'}$; ... $C_N$, $C_{N'}$), wherein each electrode pair comprises a first terminal and a second terminal, the step of measuring comprising:
   applying a first supply current, which flows from the first terminal to the second terminal of a first one of the electrode pairs;
   measuring a Hall voltage between the first terminal and the second terminal of a second one of the electrode pairs; and
   evaluating a first magnetic field component, which is perpendicular to the applied supply current and perpendicular to a connection line between the first and the second terminal of the second one of the electrode pairs, from the measured Hall voltage.

15. The method according to claim 14, further comprising carrying out the measuring using an Orthogonal-Switching-Principle or a Spinning-Current-Principle of single or repeated interchanges of the electrode pairs so as to eliminate a geometric, piezoresistive, or thermoelectric offset component.

16. The method according to claim 14, wherein the spatial magnetic field can be evaluated in a desired coordinate system from the at least three determined magnetic field components.

17. The method according to claim 14, wherein the at least three pairs of electrode pairs are associated to form at least three four-contact structures, each of which is operable to provide a variable voltage difference to allow measurement of one spatial component of the magnetic field using a Hall effect, wherein directions of at least three measured components of the magnetic field span a three-dimensional space.

18. The method according to claim 17, wherein at least three first terminals are arranged on a first surface of the base body and at least three second terminals are arranged on a second surface of the base body different from the first surface, wherein the first surface and second surface oppose each other, and the method further comprises using a Hall sensor wherein the at least three first terminals and the at least three second terminals are arranged such that their respective interconnecting lines each form a triangle, so that the three determined magnetic field components are ideally mutually orthogonal.

* * * * *